United States Patent [19]
Tatoh

[11] Patent Number: 5,907,185
[45] Date of Patent: May 25, 1999

[54] CERAMIC TERMINAL BLOCK, HERMETIC SEALED PACKAGE, AND COMPLEX SEMICONDUCTOR DEVICE

[75] Inventor: Nobuyoshi Tatoh, Itami, Japan

[73] Assignee: Sumitomo Electric Industries, Ltd., Osaka, Japan

[21] Appl. No.: 08/934,889

[22] Filed: Sep. 22, 1997

[30] Foreign Application Priority Data

Sep. 24, 1996 [JP] Japan ................................. 8-274228

[51] Int. Cl.⁶ .................... H01L 23/495; H01L 23/10; H01L 23/15
[52] U.S. Cl. .................... 257/668; 257/705; 257/706; 257/675; 257/674
[58] Field of Search .................... 257/698, 700, 257/668, 678, 703, 705, 731, 684, 690, 666, 687, 674, 675, 706; 361/813; 174/17 R, 18, 50, 50.5

[56] References Cited

U.S. PATENT DOCUMENTS 4,672,417  6/1987  Sugiyama et al. ................ 257/712

FOREIGN PATENT DOCUMENTS

| | | | |
|---|---|---|---|
| 503 200 | 9/1992 | European Pat. Off. . | |
| 691555 | 1/1996 | European Pat. Off. . | |
| 58-57742 | 10/1981 | Japan | 257/698 |
| 58-161351 | 9/1983 | Japan | 257/698 |
| 61-53746 | 3/1986 | Japan | 257/698 |
| 62-123745 | 6/1987 | Japan | 257/700 |
| 3-39867 | 4/1991 | Japan . | |
| 5-15440 | 2/1993 | Japan . | |
| 5-67844 | 3/1993 | Japan . | |
| 8-37247 | 2/1996 | Japan . | |

*Primary Examiner*—Mahshid Saadat
*Assistant Examiner*—Jhihan B. Clark
*Attorney, Agent, or Firm*—Pillsbury Madison & Sutro LLP

[57] ABSTRACT

This invention provides a package for complex semiconductor devices and a ceramic terminal block useful for the package. For example, the package might contain a semiconductor laser diode and a Peltier device for cooling the laser diode. A ceramic terminal block has metallized electrode patterns formed thereon which extend inside and outside the package. Grooves are formed in some of the metallized electrode patterns for the leads of the Peltier device. Inward extending leads are fixed on the grooves of the electrode patterns for the Peltier leads. The leads of the Peltier device are soldered to the inward leads.

22 Claims, 6 Drawing Sheets

CERAMIC TERMINAL BLOCK, HERMETIC SEALED PACKAGE, AND COMPLEX SEMICONDUCTOR DEVICE

BACKGROUND OF THE INVENTION

1. Field of Invention

This invention relates to a package for complex semiconductor devices and a ceramic terminal block useful for the package. Here, the complex semiconductor device means that more than one device is accommodated into one package, and more particularly, means one of the semiconductor devices has already been provided with its own leads as connecting terminals. This invention can be applied to many kinds of complex semiconductor devices, but a semiconductor package accommodating both a Peltier device and a semiconductor laser will be explained as an example of the present invention.

2. Description of Related Art

This application claims the priority with respect to Japanese Patent Application No. 274228/1996 filed Sep. 24, 1996, the subject matter of which is incorporated by reference, as if fully set forth herein.

Since semiconductor lasers (LDs) and light emitting diodes (LEDs) inherently emit light by supplying current, they are strongly running hot. An excessive rise of the temperature of the light emitting devices brings about a decrement of emission efficiency. Therefore, the devices must be cooled as to prevent the reduction of efficiency or as to generate light of great power.

A heat sink is often effective only for cooling the heated devices, but is sometimes insufficient to cool overheated devices, because the cooling capacity of the heat sink depends on natural radiating. Further, the performance of devices must often be stabilized, by keeping the devices at a constant temperature. Furthermore, even in the case of photodetectors, for example, an avalanche photodiode, dissipating much heat, requires a certain cooling mechanism. Strict temperature control is needed for a sophisticated photodiode that has a light receiving layer with an MQW (Multi-Quantum Well) structure, by utilizing the transition between side modes and so on for obtaining a high sensitive wavelength selectivity.

It may be considered that the whole of devices would be put into a thermostatic bath in order to control the temperature or to cool the devices. This method is, however, unrealizable, because it would decrease the freedom of designing optical systems and it would significantly increase the cost of production.

As a practical matter, it is possible to provide a package structure into which a Peltier device can be placed, and to place a laser, a photodiode, a light receiving device, and various circuit devices on the Peltier device so that they can be thermally controlled. A Peltier device, being a type of semiconductor device, is small enough to be accommodated in a package with other semiconductor devices. A Peltier device is made by layering a metal, a p-type semiconductor, a metal, an n-type semiconductor and a metal in order. The temperature of the intermediate metal layers can be varied by changing the direction of current flowing through the device. When a current flows in one direction, an intermediate electrode radiates heat, and when a current flows in the reverse direction, the intermediate electrode absorbs heat.

The adjustments of the current direction and the current quantity make it possible to control the temperature of the intermediate electrode of the Peltier device. It is, in general, possible to heat and cool an object device by mounting it onto an intermediate electrode with an insulator and supplying a current to the Peltier device. Further, the object device can be maintained at a predetermined temperature by measuring its temperature using a chip-thermistor and making appropriate adjustments to the current flowing through the Peltier device.

Such a complex semiconductor device accommodates a Peltier device and a semiconductor laser together in a package. Several complex semiconductor devices have been proposed, which will be explained briefly as follows:

(1) JAPANESE LAID OPEN UTILITY MODEL NO.3-39867 (39867/1991)
TITLE OF THE UTILITY MODEL: "SEMICONDUCTOR LASER MODULE"

The main object of this utility model laser module is to control the temperature of a semiconductor laser by a Peltier device put into the package. Electrode pads of the semiconductor laser are connected to package electrode patterns with ribbon-type leads.

(2) JAPANESE LAID OPEN UTILITY MODEL NO.5-15440 (15440/1993)
TITLE OF THE UTILITY MODEL: "PACKAGE FOR ACCOMMODATING AN OPTICAL SEMICONDUCTOR DEVICE"

This utility model puts a Peltier device on the bottom board of the package, deposits an insulator on the Peltier device, and puts a semiconductor laser on the insulator.

(3) JAPANESE LAID OPEN PATENT NO.5-67844 (67844/1993)
TITLE OF THE INVENTION: "SEMICONDUCTOR LASER MODULE"

This invention proposes a package having a bottom board being made of AlN (aluminum nitride), a plurality of Peltier units attached to the bottom board, a semiconductor laser, a light receiving device and so on placed on the Peltier devices. The semiconductor laser is positioned on a heat sink put on the Peltier devices. However, in this structural arrangement including a Peltier device in a package, there is a difficult problem of an electric contact between the Peltier device and the package. The above cited prior art documents (1) to (3) mention nothing about the contact between electrode patterns of a package and leads of a Peltier device. There are no suggestions for arrangements to provide electrical contacts.

The electrical wiring in a package is done by bonding conductive pattern electrodes on a ceramic terminal block to electrode pads formed on a light emitting device, a photodetector and ICs of e.g., an amplifier circuit, a logic circuit and so on, with wires of gold (Au) and so on. This requires that the electrode pads on the devices and the patterned electrodes on the ceramic terminal should be arranged approximately at the same level, that is, the difference in height between the terminal electrode patterns and the electrode pads must be small. This requirement is based on the small length of a needle part of a bonding tool.

Generally a Peltier device is put at the intermediate level between the package bottom surface and the devices, that is, a laser diode, a photodetector, an amplifier circuit, a logic circuit and so on that radiate heat. There is a difference in height between the Peltier device electrodes and pattern electrodes on the ceramic terminal block. The wirebonding of, for example, gold(Au) therebetween is so difficult that the Peltier unit is usually accommodated in its own package having lead pins. Then the Peltier device is independently used unlike other devices.

The leads of the Peltier device are soldered to the pattern electrodes on the terminal block so as to establish electric conduction between the package and the Peltier device.

There are several problems in the step of soldering leads of the Peltier device with conducting parts (electrode patterns) of the ceramic terminal block. Heating the whole of the package is desirable from the viewpoint of soldering, but the Peltier device that is an thermoelectric cooling device is deficient in thermal stability. When an electron device like a Peltier device having such a poor thermal stability were entirely heated, the electron device would be destroyed by the heat. Hence, the lead-electrode pattern soldering by heating all is impossible.

At the present time, lead pins of the Peltier device and metallized electrode patterns are soldered by the processes of bending ends for the lead pin at an adequate angle, putting the lead pins on electrode patterns, heating both the pins and the electrode patterns, and soldering the lead pins on the metallized electrode patterns.

Soldering by hand work has disadvantages. For example, hand soldering takes much time. As mentioned above, the leads of the Peltier device should be bent, should be brought into contact with the wire, and should be heated by attaching a soldering iron, as pressing the lead with a pair of cutting pliers. Further, a solder should be supplied to the heated lead, be melted, and be extended on the metallized wire. After the solder had been solidified, a tip of the cutting pliers should be removed from the lead. There are many metallized electrode patterns in a package and the area of an electrode pattern for soldering a lead is very narrow. The electrode patterns are flat and there is nothing to hold the leads temporarily, so that cutting pliers or tweezers are necessary for keeping the leads whenever the leads are soldered to the electrode pattern. This hand work requires much time and high skill. At the present, it takes several minutes to solder a lead pin with a metallized electrode (pattern).

When hard and thick leads are connected to electrode patterns by soldering, faulty soldering is apt to occur. Even when the soldering seems to be perfect, there sometimes occurs a faulty soldering connection. In this case, it is impossible to find out the faulty condition without conducting a test. Furthermore, it is difficult to distinguish the electrode patterns to be connected with the Peltier device leads from a number of other metallized electrode patterns by mere eye observation. There exists only numbers for designating the wires to be connected with the leads of the Peltier device. Therefore, there is a possibility of connecting the Peltier device leads to wrong electrode patterns by soldering.

These drawbacks result from the fact that thin metallized electrode patterns of a package are not suitable for the connection with a hard thick material like a lead. Originally, the metallized electrode patterns are not for soldering of thick leads but for wirebonding of thin wires.

FIG. 1 shows a part of a terminal structure on a ceramic block of a prior package including some improvements which was proposed by:

(4) JAPANESE LAID OPEN PATENT NO.8-37247 (37247/1996)
TITLE OF THE INVENTION: "PACKAGE FOR ACCOMMODATING OPTICAL SEMICONDUCTOR DEVICES"

FIG. 1 (Prior Art) is an explanatory figure for showing a part of the ceramic terminal block being a part of the package. In general, a metallized electrode patterns 1 are printed on a ceramic block 2, and a part of an upper surface 6 of the ceramic terminal block 2 is pressed by a ceramic block 3. The upper surface 6 of the terminal block 2 is level, and a front end surface 4 of the ceramic terminal block 2 is flat.

A semicylindrical groove 5 is bored on the front end surface 4 of the ceramic block 2 in order to obtain an easy positioning of a lead 8 of a Peltier device. The lead 8 of the Peltier device is fitted vertically to the semicylindrical groove 5, and is connected to the metallized wire 1 by a solder 7. The other electrode patterns have no grooves, so that it is easy to distinguish the electrode patterns for the leads 8 from a lot of other electrode patterns for wirebonding.

FIG. 2 (Prior Art) shows a state where the lead 8 of the Peltier device is connected to the predetermined electrode pattern 1 by the solder 7. As explained above, the groove 5 prevents the connection between the lead 8 and the electrode pattern 1 from making a mistake, and gives rise to a simplified soldering of the lead on the electrode pattern without pressing the lead with cut pliers or tweezers.

Metallized electrodes printed on a terminal block should be ordinarily connected to pads of IC chips having no leads by wirebonding. The head capacity is not appropriate for soldering. The Peltier device lead should be bent for connecting the lead to the electrode pattern. An unsuitable bend on the tip results in default of connection between the lead and the electrode pattern.

An operator must press the lead with a soldering iron, holding the lead with pliers or tweezers for forcing the lead to the electrode pattern. The metallized electrode patterns are thin, but their practical thermal capacity is comparatively large. The electrode pattern must be heated by contacting a tip of the soldering iron till the electrode pattern is heated up to a temperature more than the melting point of the solder. Since ceramic has high thermal conductivity, heat escapes from the electrode pattern. Hence, it is difficult to raise the temperature of the electrode pattern. It takes a certain time on heating the wire part up to more than the melting point of the solder, which is a cause of taking much time to solder the Peltier device lead to the electrode pattern. Further, a high degree of proficiency is required for soldering.

The prior document (4) (37247/96) would not commit an error in connecting the lead of the Peltier device to the electrode pattern due to the longitudinal groove drilled in the side surface of the metallized part. Since the position of the lead is predetermined by the groove, soldering is easily carried out. However, the arrangement shown in document (4) does not solve the problem of direct-connection between the lead and the electrode pattern. It takes much time to heat the electrode pattern having a large practical heat capacity by a soldering iron. As shown in FIG. 2, since the lead is connected at right angles to the electrode pattern by soldering, the soldered area is so narrow that the connection power of soldering becomes weak. The solder connection is likely to break down by the cycle of temperature changes and some vibrations.

SUMMARY OF THE INVENTION

It is an object of the present invention to provide a package structure and a terminal block structure that makes it easy to solder connect leads of a Peltier device with an electrode pattern.

Another object of the present invention is to provide a package structure and a terminal block structure capable of enduring the repeated use of Peltier lead without the accident of separating from the wire.

To solder leads of an electronic device, this invention previously attaches extra leads made from a metal for soldering to the electrode patterns printed on a terminal block of a package. The attached leads project inwards from the metallized electrode patterns. Hence, the inward leads are attached to the electrode patterns in advance. The leads of a Peltier device are then connected to the inward leads by soldering, that is, they are not directly connected to the electrode patterns but are connected to the electrode patterns via the inward leads.

DETAILED DESCRIPTION OF PREFERRED EMBODIMENTS

This invention is directed to a terminal block and a package. Inward extra leads are soldered on the electrode patterns in advance. The leads of a Peltier device are soldered to these inward projected leads. An operator never makes a mistake of confusing the electrode patterns with others, because it is easy at a glance to distinguish the electrode patterns having the extra leads for the Peltier leads from the other electrode patterns.

A tip part of the inward lead has a small effective heat capacity, because the tip part is far away from a ceramic substrate. The inward lead is heated quickly by touching it with a soldering iron due to the small heat capacity. The soldering is congruous in the connection between the leads having the same quality. The Peltier leads can be naturally pressed to the inward leads by the elastic force of the inward lead tips without pressing the lead tips by cut pliers or tweezers. No skill is required for the operation of soldering. It is possible to shorten the time of soldering because of the decrease of heating time.

The lead—lead soldering stands up with high resistance against external forces, for example, vibration and so on, because both leads having the same quality have the same deformation.

BRIEF DESCRIPTION OF THE DRAWINGS

FIG. 3 and FIG. 4 show structures for mounting an electronic part, such as, for example, an electronic cooling device, in a package. Ceramic terminal blocks 2 and 3 are fixed by side walls of the package, as being projected inward and outward. The package contains a bottom plate 9, rectangular ceramic frames 10 and 11 and a lid. The lid is not shown in FIG. 3 and FIG. 4.

Figure 1:
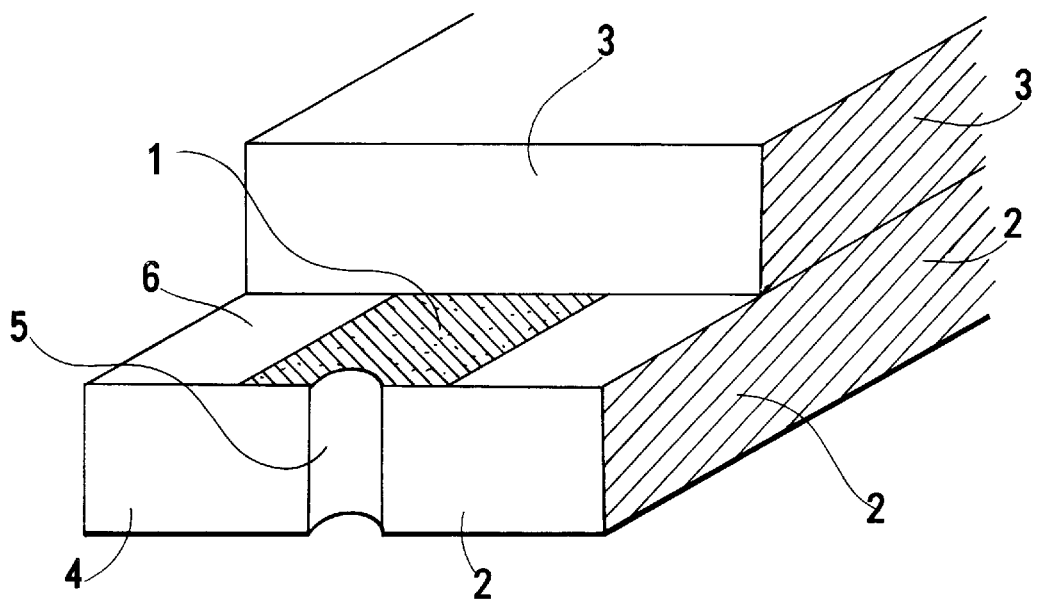
FIG. 1 (Prior Art) is a partial perspective view of the package showing structure for attaching a Peltier device lead, which is disclosed by Japanese Laid Open Patent No. 8-37247 (37247/96).

A plurality of metallized parallel electrode patterns 1, 1, . . . are formed on ceramic terminal block 2. Each electrode pattern includes an inner electrode pattern 1 inside of the ceramic frame 10 and an outer part 17 outside of the ceramic frame 10. These electrode patterns 1 and 17 are printed as a body. An outer lead 18 is connected to each outer electrode pattern 17. Here, the outer electrode patterns 17 and the outer leads 18 are shown as a single body. A lead frame 19, the outer leads 18, the outer electrode patterns 17 and the inner electrode patterns 1 are made as a single body.

Figure 3:
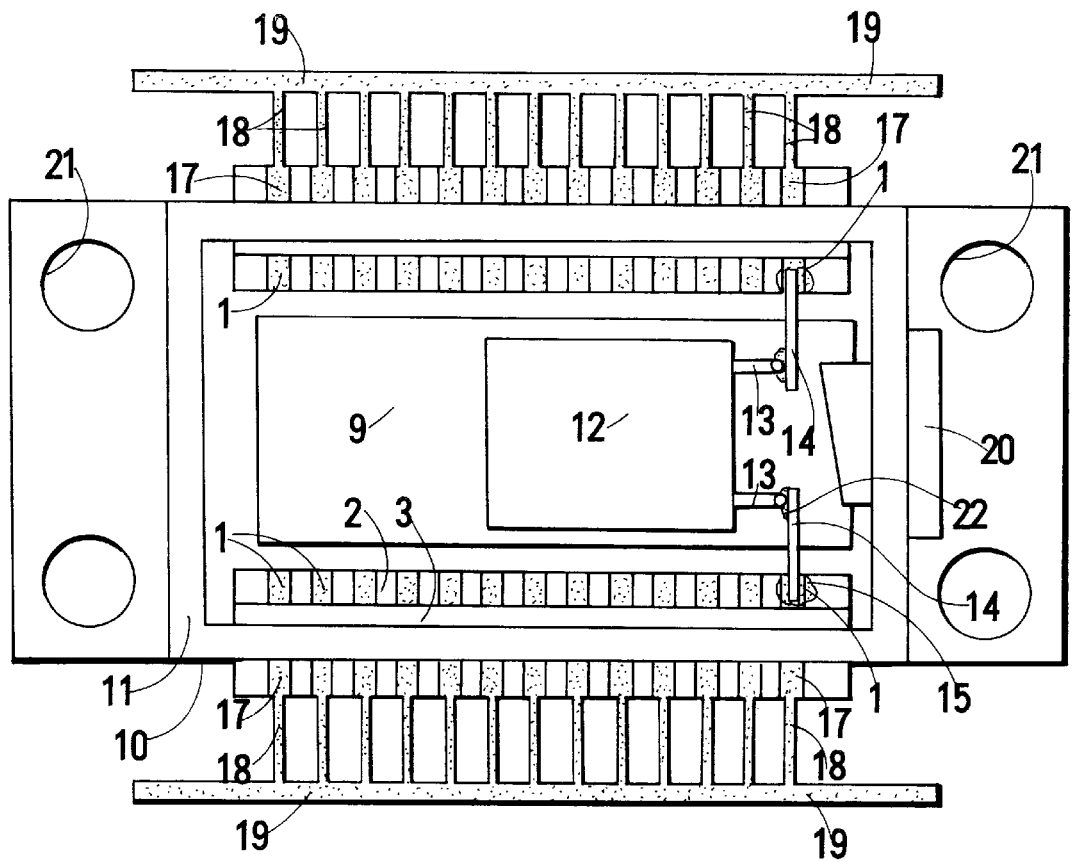
FIG. 3 is a plan view of the package (without a cap) for a semiconductor device according to an embodiment of the present invention.
Figure 4:
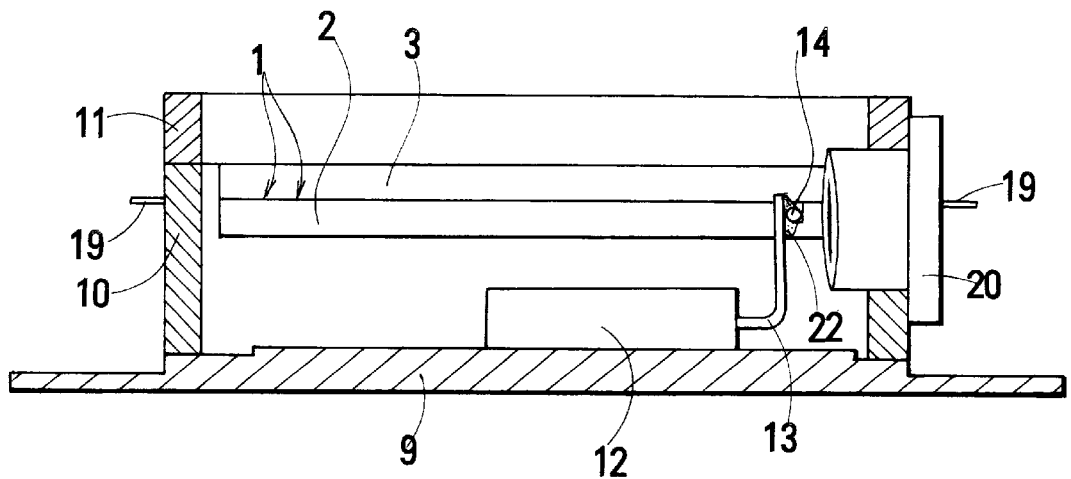
FIG. 4 is a longitudinal side view of the package shown in FIG. 3.

The regions having a high electric conductivity are shown dotted in FIG. 3 and FIG. 4. Although the outer leads 18 are shown to be relatively short because of the restriction of a drawing area, actual outer leads 18 are longer than suggested by the drawing. Each outer lead 18 becomes an independent pin when the leads 18 are cut and its lead frame 19 is eliminated. In this case, the lead frame is produced by stamping out a metal board by a die shaping the electrode patterns, and by gluing the inner ends of the lead frame to the ceramic terminal block 2. An alternative is to print the metallized electrode patterns 1 and 17 on the ceramic block 2, and connect the cut thin outer leads 18 to the outer electrode patterns 17 by brazing. Either way, each outer lead 18 of the lead frame is electrically-connected to its corresponding inner electrode pattern 1.

A Peltier device 12 (electronic cooling device) is attached to the bottom plate 9. The electronic cooling device has two leads 13 and 13 that outwardly project from one side surface of the device. A semiconductor laser, a photodiode, an amplifier circuit and so on will be loaded on the Peltier device 12. FIG. 3 and FIG. 4 show the state of the package before these devices are loaded. Most of the metallized electrode patterns 1, 1 . . . are the pads to be connected to the semiconductor laser, photodiode, amplifier circuit and so on by wirebonding. Only one pair of electrode patterns positioned in both ends, for example, in the right ends in FIG. 3, are connected to the leads 13 of the Peltier device, respectively. Short inward leads 14 and 14 are fixed to the end pads 1 and 1 respectively. Practically, grooves 23 have been formed on the electrode patterns in the wire direction, and each inward lead end is buried in and fixed to each groove 23. Brazing is the most suitable as a fixing means 15.

The leads 13 of the Peltier device are appropriately bent, and are brought in contact with the inward leads 14, respectively. Soldering of the Peltier lead 13 with the inward lead 14 is carried out by touching the contacting part by a solder iron, melting solder on the contact part, removing the solder iron, and cooling the solder to stiffen it. Small thermal capacity brings about a quick heating of the lead-lead contact. The time of soldering is also short. The Peltier device is connected to the inner electrode patterns 1 through the leads 13 of the Peltier device 12 and the inward leads 14.

There is a socket 20 for introducing an optical fiber in on an end surface of the package frame 10. Holes 21 for attaching screws are formed on four corners of the bottom board 9. A module having a semiconductor laser and a photodiode for monitoring (sometimes including an amplifier circuit) will be attached to the Peltier device 12. Electrode pads for the laser, photodiode and other circuit device chips will be connected to the remaining inner electrode patterns 1, respectively by wirebonding. A ceramic cap will bonded to the frame 11.

Figure 5:
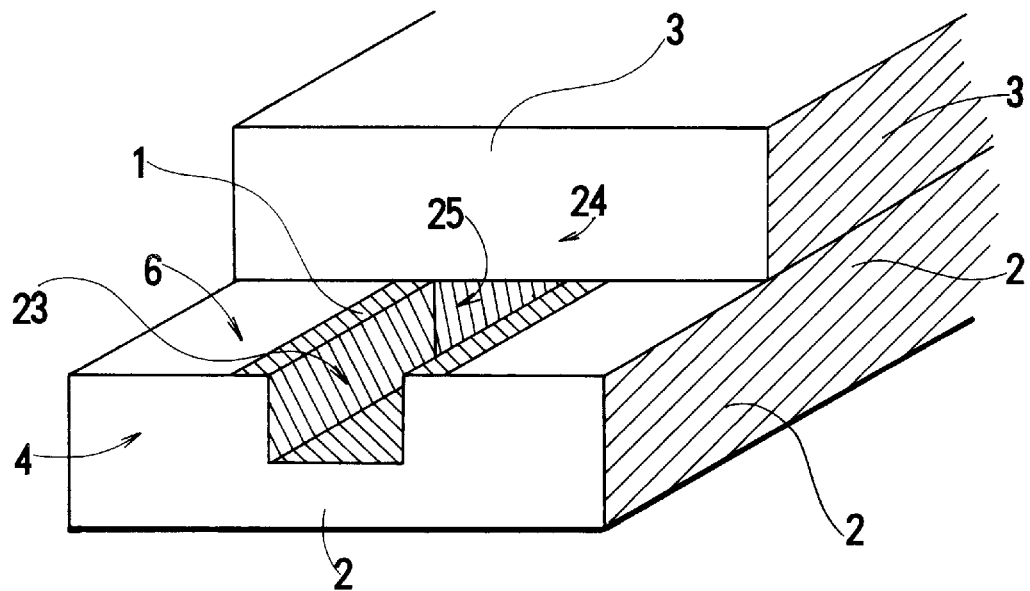
FIG. 5 is a partial perspective view of a ceramic terminal block according to a first embodiment of the invention.

FIG. 5 is an enlarged perspective view of a part of the terminal plate to be provided with an inward lead. Only one of the metallized electrode patterns shown in FIG. 3 and FIG. 4 is shown in FIG. 5. The ceramic terminal block 2 is a long ceramic plate having a certain width, as shown in FIG. 3. Parallel or radial metallized electrode patterns 1 and 17 are printed on the ceramic plate. Another ceramic terminal block 3 having a width narrower than the ceramic terminal block 2 is adhered to the ceramic terminal block 2 for hermetic (airtight) sealing. FIG. 5 shows an enlarged view of a part of the wider and narrower ceramic terminal blocks.

A groove 23 is formed in parallel with the electrode pattern in the center of the electrode pattern 1. An end surface 25 of the groove 23 coincides with the front surface 24 of the upper terminal block 3. The groove 23 having a rectangular section is formed in the area between the front end surface 4 of the block 2 and the front surface 24 of the other terminal block 3. The groove 23 is formed as to stably support the inward lead.

Figure 6:
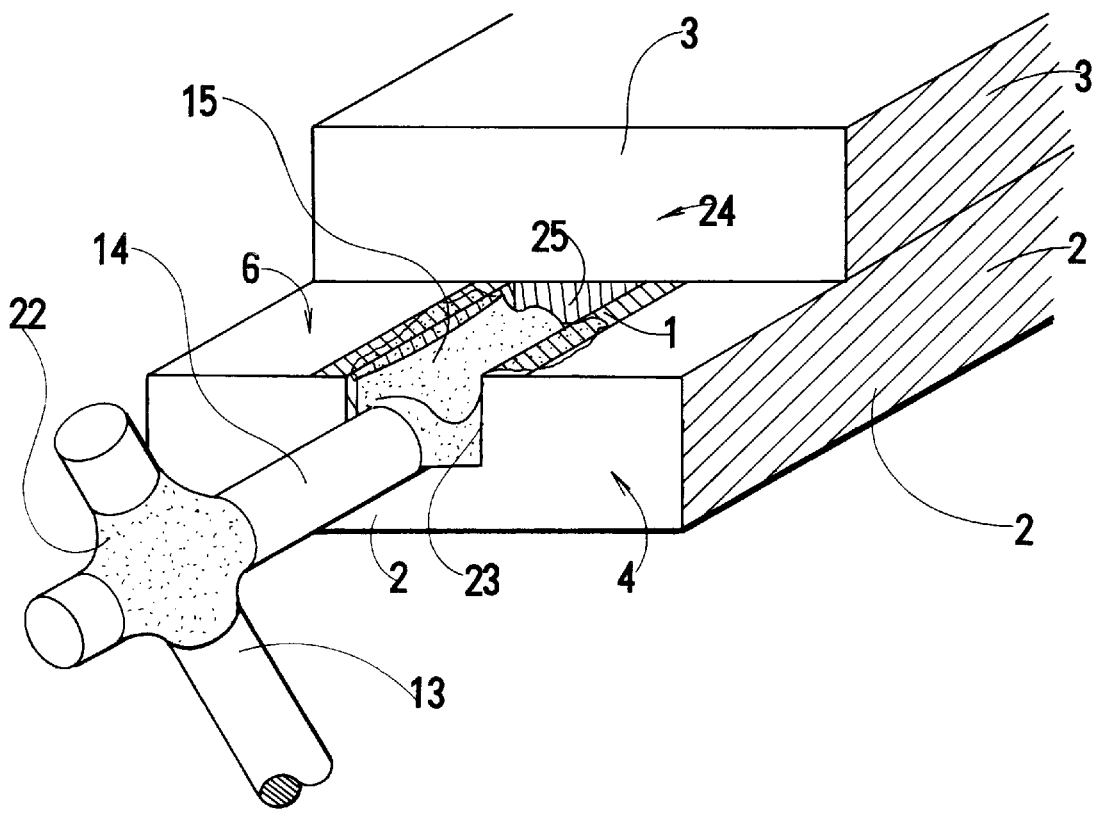
FIG. 6 is a perspective view of the terminal block shown in FIG. 5 after an inward lead has been attached to the ceramic terminal block, and the Peltier device lead has been connected to the inward lead by soldering.

FIG. 6 shows the state in which the inward lead 14 is fixed to the groove 23, and the Peltier device lead 13 is soldered to the inward lead 14. The inward lead 14 is a straight and short lead, inserted into the groove 23, and fixed to the wire 1 by a silver braze 15. The lead 14 and the electrode pattern 1 are electrically connected with each other. Here, the lead 14 is made from copper (Cu) wire that is excellent in conductivity and is plated with nickel (Ni). In FIG. 3, the electrode patterns requiring the inward leads are formed on both sides of the package along the same lines, so that a lead having a length bridging two electrode patterns is inserted into both the grooves, and both ends are connected to the wires by soldering. After that, an unnecessary middle part is cut off to become two leads.

The Peltier device with leads bent is installed in the package, and the Peltier leads are soldered to the inward leads 14.

When the lead frame 18 is inherently made from a metal plate separated from the metallized electrode pattern 17 it is necessary to braze the lead frame 19 to the metallized electrode patterns 17. This silver brazing is carried out at the same time as brazing the inward leads 14 on the electrode pattern 1. Further, gold is plated on the metallized parts so as to increase the electric conductivity and solder wettability of the electrode pattern.

Figure 7:
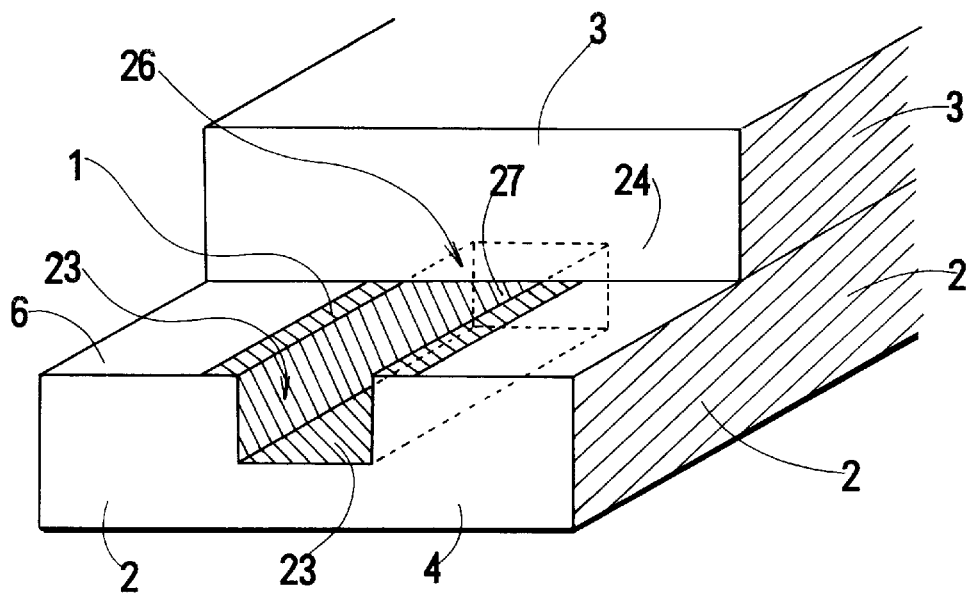
FIG. 7 is a partial perspective view of a ceramic terminal block according to a second embodiment of the invention.
Figure 8:
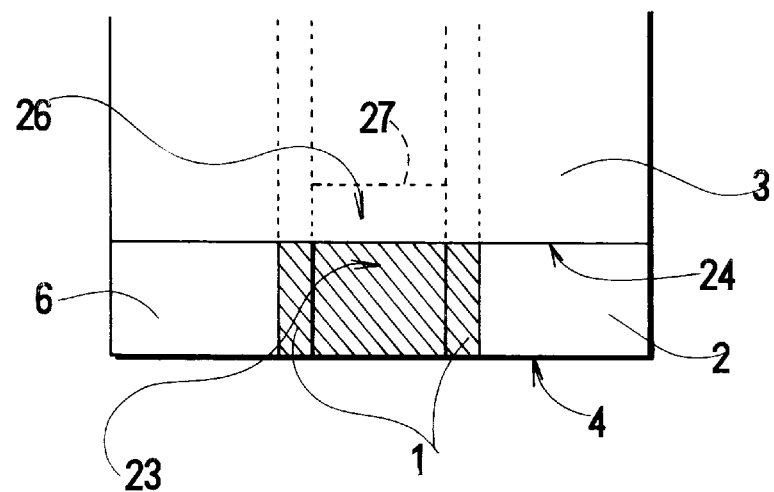
FIG. 8 is a plan view of a part of the ceramic terminal block shown in FIG. 7.
Figure 9:
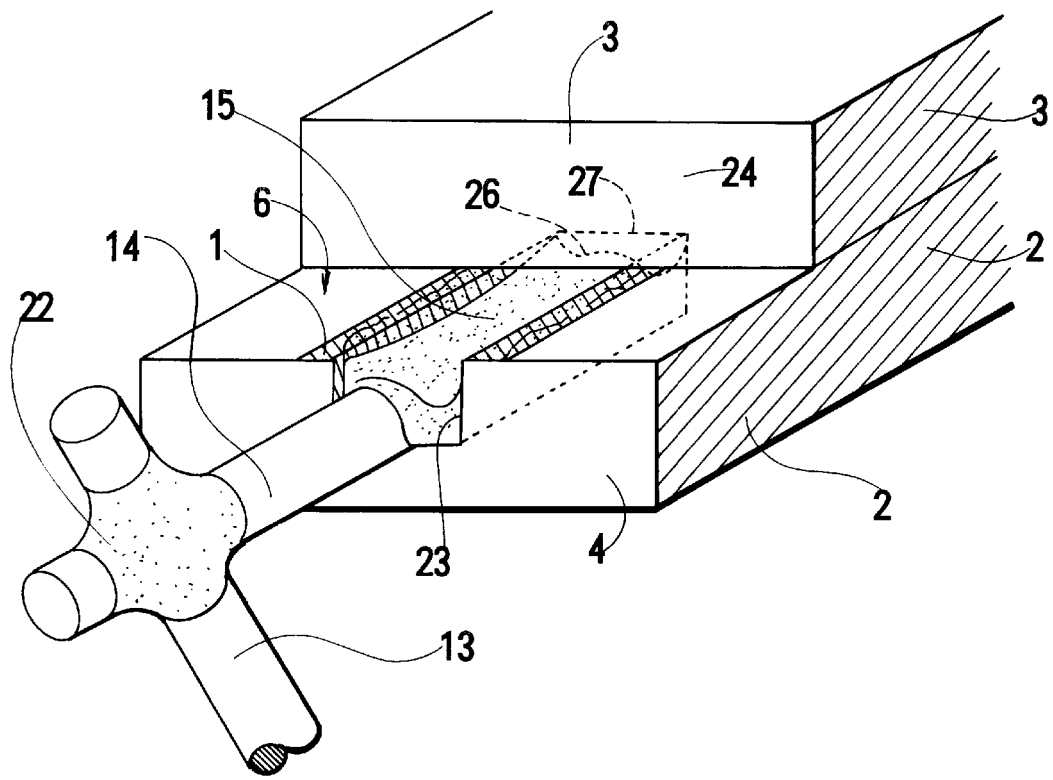
FIG. 9 is of the terminal block shown in FIG. 7 with an inward lead soldered to the ceramic terminal block, and after a lead of a Peltier device has been soldered to the inward lead.

FIG. 7, FIG. 8 and FIG. 9 show another embodiment of the invention. In this embodiment groove 23 extends further inside in the ceramic terminal block 2 and bores a prolonged hole 26. An end surface 27 of the hole 26 is placed behind the front surface 24 of the upper terminal block 3. When the inward lead 14 is inserted into the groove 23, the lead 14 is maintained as it is by the prolonged hole 26. The inward lead 14 is connected to the electrode pattern 1 by silver brazing in the condition being kept in the groove 23 by the hole 26. The prolonged hole allows for cantilevering an inward lead temporarily. Even a short lead can be cantilevered by the extended hole. In FIG. 3, two leads are positioned along the same line, but there is a possibility that two leads must be attached in different lines of the electrode pattern array. In such a case, it is not feasible to bridge a long lead between the grooves and to support the lead temporarily by the grooves. Temporary support by the grooves is provided for a single and short lead. Therefore, the groove having the prolonged hole 26 shown in FIG. 7 to FIG. 9 is more convenient for connecting inward leads on the electrode patterns of different lines.

Figure 10:
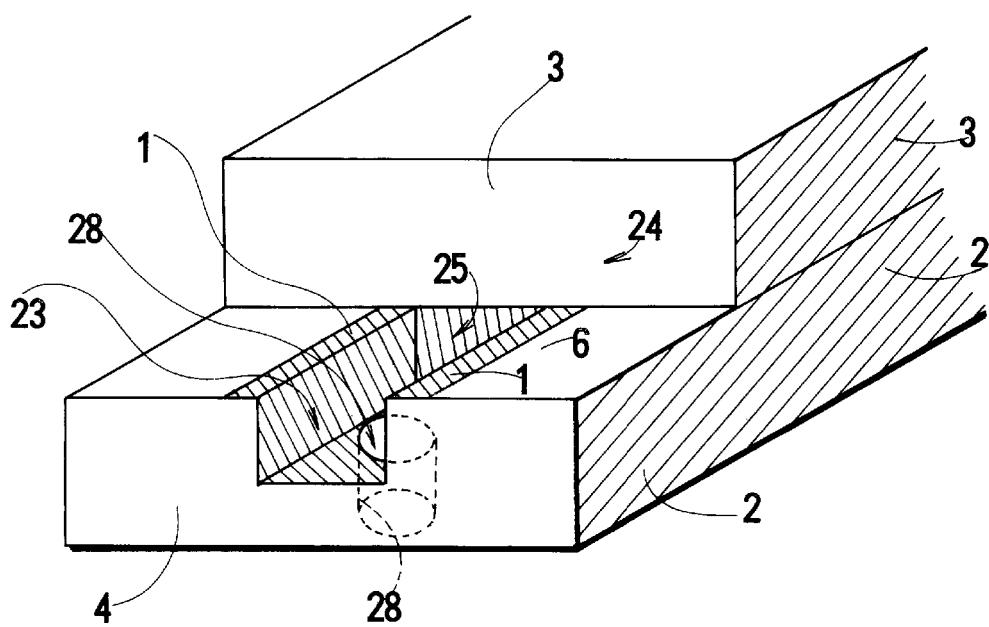
FIG. 10 is a partial perspective view of the ceramic terminal block according to a third embodiment of the invention.
Figure 11:
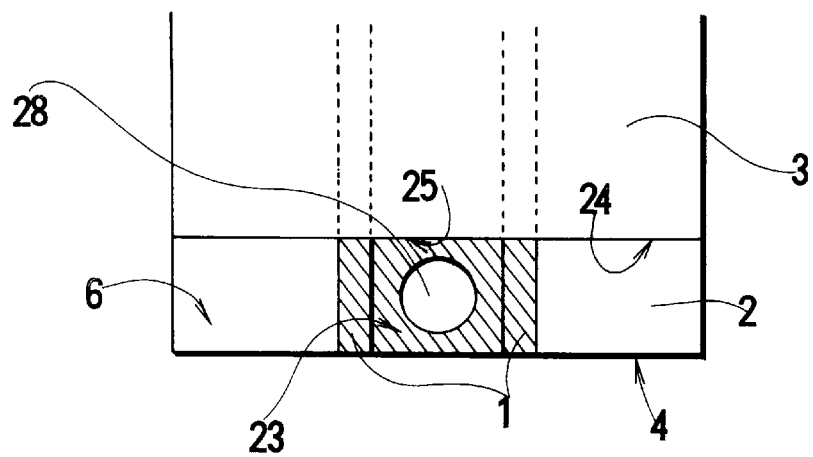
FIG. 11 is a plan view of the ceramic terminal block shown in FIG. 10.
Figure 12:
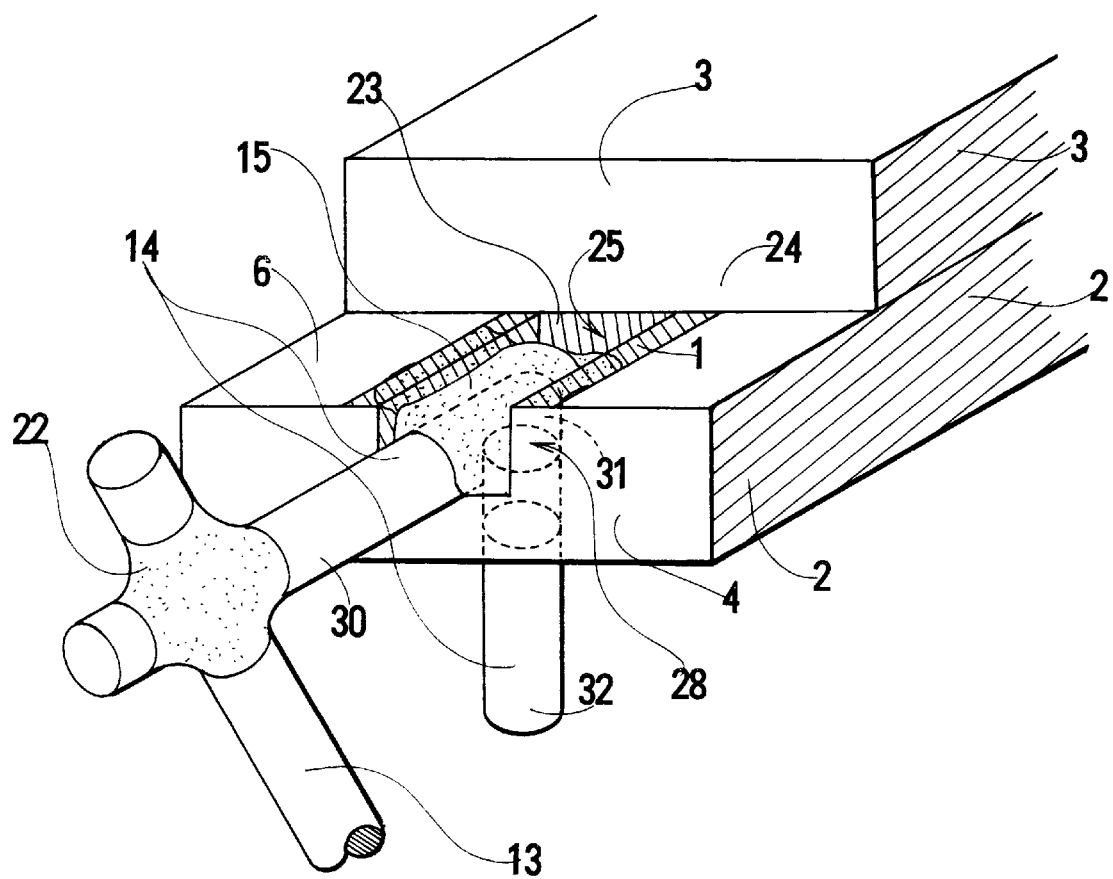
FIG. 12 is a perspective view of the terminal block with an inward lead attached to the ceramic terminal block, and after a lead of a Peltier device has been solder connected to the inward lead.

FIG. 10, FIG. 11 and FIG. 12 show another embodiment of the invention. This embodiment strengthens the function of temporary support of an inward lead. A hole 28 is vertically drilled at the bottom of the groove 23. A lead 14 is not a simple straight line, but is bent like an L-type structure consisting of a horizontal part 30, a right angle part 31 and a trailing part 32. A tip of the trailing part 32 is inserted into the hole 28, and the horizontal part 30 is placed in the groove 23. This provides temporary support for the L-type lead 14 on one side. Such a temporary stop is effective in connecting the lead 14 with two electrode patterns that are placed in asymmetrical positions. While supporting the lead 14 by the hole, the horizontal part 30 and the right angle part 31 are fixed by a silver braze 15 to the electrode pattern 1. The wire 1 and the L-type lead 14 are electrically coupled. A Peltier device lead 13 is soldered to the lead 14 by a soldering iron, as in the other embodiments previously described.

It requires a skill to solder a bent lead to a metallized electrode pattern of a package directly. It takes about two minutes for a skilled laborer to connect a lead to a electrode pattern in the conventional manner.

This invention simplifies the operation of soldering and reduces the time of soldering. Further, this invention prevents mistakes of connecting Peltier leads with corresponding metallized electrode patterns, because the inward leads have previously been fixed to the groove. Soldering can be easily carried out by an unskilled laborer. The time necessary for soldering the leads is decreased to about 30 seconds. The operation of connecting inward leads with metallized electrode patterns is newly introduced in addition to the ordinal operation. This additional operation is, however, too simple to take time. Furthermore, the soldering is so perfect that it does not come off. No soldering defects could be found during a post-soldering screening.

Figure 2:
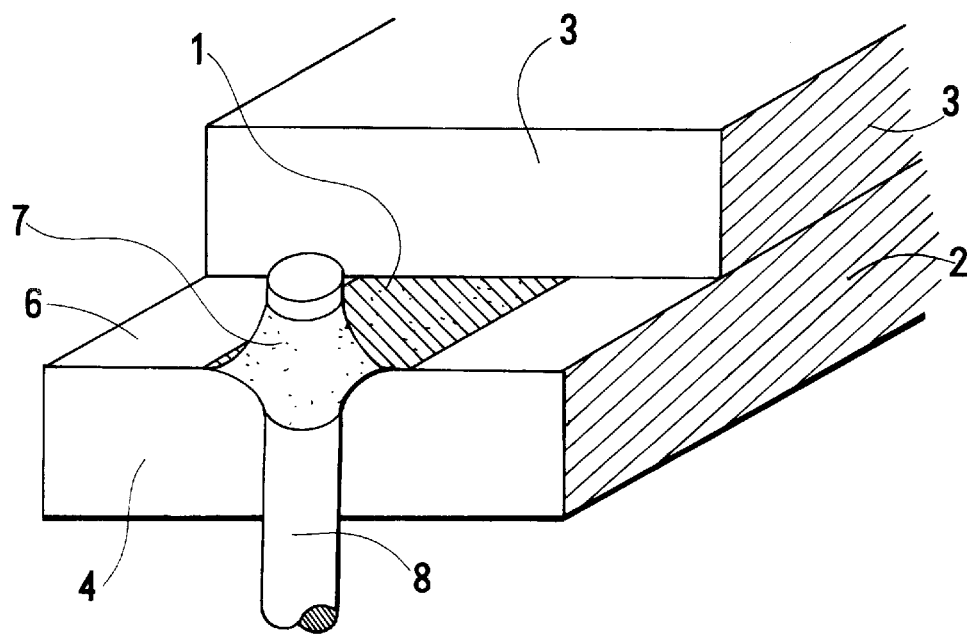
FIG. 2 (Prior Art) is a partial perspective view of the package shown by FIG. 1 after the Peltier device lead has been connected to an electrode pattern by soldering.

During connection between the inward lead and the metallized electrode pattern the lead is maintained perfect because the lead is horizontally kept in the groove bored in the terminal block. As shown in FIG. 2, the connection between a vertical lead and a horizontal metallized electrode pattern is so weak that the soldering easily comes off. The connection between the inward lead and the groove pattern raises the reliability in soldering. There occurs no error of the position of connection therebetween.

The time of heating is reduced, because a lead of a Peltier device or other device is connected to an inward lead having a small thermal capacity. The time required for soldering is shortened. Further, firm soldering takes place due to the connection between the leads having similar elastic deformation. The soldering is endowed with a high reliability.

What I claim:

1. A terminal block arrangement for a semiconductor package, comprising:

an insulated ceramic block component;

conductive electrode patterns formed on the ceramic block component and having a portion inside of the package and a portion extending outside of the package on said ceramic block component; and inward lead elements attached to at least some of the electrode patterns and extending inwardly inside of the package.

2. A terminal block arrangement as claimed in claim 1, wherein at least the center part of the inward lead is made from copper (Cu).

3. A terminal block arrangement as claimed in claim 1, wherein the conductive electrode patterns are connected to the inward leads by silver brazing.

4. A terminal block arrangement as claimed in claim 1, wherein the inward leads are fixed in grooves formed in parallel with the electrode patterns by boring a part of the ceramic terminal board, and is electrically connected to the conductive electrode patterns.

5. A terminal block arrangement as claimed in claim 1, wherein the inward leads are bent like an L-type, are fixed by holes formed by drilling the ceramic board vertical to the electrode pattern, and is electrically connected to the conductive electrode patterns.

6. A terminal block arrangement as claimed in claim 1, wherein the inward leads are bent like an L-type, are fixed by grooves formed by boring a part of the ceramic part of the electrode patterns and by holes formed by drilling a part of the grooves, and are electrically contacted to the electrode patterns.

7. A terminal block arrangement as claimed in claim 2, wherein the conductive electrode patterns are connected to the inward leads by silver brazing.

8. A terminal block arrangement as claimed in claim 2, wherein the inward leads are fixed in grooves formed in parallel with the electrode patterns by boring a part of the ceramic terminal board, and is electrically connected to the conductive electrode patterns.

9. A terminal block arrangement as claimed in claim 2, wherein the inward leads are bent like an L-type, are fixed by holes formed by drilling the ceramic board vertical to the electrode pattern, and is electrically connected to the conductive electrode patterns.

10. A terminal block arrangement as claimed in claim 2, wherein the inward leads are bent like an L-type, are fixed by grooves formed by boring a part of the ceramic part of the electrode patterns and by holes formed by drilling a part of the grooves, and are electrically contacted to the electrode patterns.

11. A terminal block arrangement as claimed in claim 3, wherein the inward leads are fixed in grooves formed in parallel with the electrode patterns by boring a part of the ceramic terminal board, and is electrically connected to the conductive electrode patterns.

12. A terminal block arrangement as claimed in claim 3, wherein the inward leads are bent like an L-type, are fixed by holes formed by drilling the ceramic board vertical to the electrode pattern, and is electrically connected to the conductive electrode patterns.

13. A terminal block arrangement as claimed in claim 3, wherein the inward leads are bent like an L-type, are fixed by grooves formed by boring a part of the ceramic part of the electrode patterns and by holes formed by drilling a part of the grooves, and are electrically contacted to the electrode patterns.

14. A terminal block arrangement as claimed in claim 7, wherein the inward leads are fixed in grooves formed in parallel with the electrode patterns by boring a part of the ceramic terminal board, and is electrically connected to the conductive electrode patterns.

15. A terminal block arrangement as claimed in claim 7 wherein the inward leads are bent like an L-type, are fixed by holes formed by drilling the ceramic board vertical to the electrode pattern, and is electrically connected to the conductive electrode patterns.

16. A terminal block arrangement as claimed in claim 7, wherein the inward leads are bent like an L-type, are fixed by grooves formed by boring a part of the ceramic part of the electrode patterns and by holes formed by drilling a part of the grooves, and are electrically contacted to the electrode patterns.

17. A airtight sealed package for a semiconductor device, comprising:
   a bottom board member for sustaining semiconductor devices;
   ceramic frame components fixed on the bottom board;
   a cap member covering said frame components;
   ceramic terminal block components penetrating side surfaces of the ceramic frame components and having an outer part and an inner part, while keeping an inner space of the package hermetically sealed;
   conductive electrode patterns formed on at least one of the ceramic terminal block components and extending from an outside of the ceramic frame components to an inside of the ceramic frame components for electrically connecting outer leads connected to said conductive electrode patterns extending outside of the frame components with electrodes of the inner semiconductor devices, wherein metallized grooves are formed on some of the conductive electrode patterns on at least one of said terminal block components; and
   inward lead elements each having a first end glued in the metallized grooves of the electrode patterns within the ceramic frame components and having a free second end projecting inward in the inner space of said frame components for soldering leads of the semiconductor devices.

18. A package as claimed in claim 17, wherein at least the center part of the inward lead elements are made from copper.

19. A package as claimed in claim 17, wherein the inward lead elements are connected to the conductive electrode patterns at each first end by silver brazing.

20. A package as claimed in claim 17, wherein a hole is formed in the metallized groove in the vertical direction, the inward lead elements are bent in an L like shape and the bent end of the inward lead elements are inserted in the hole and brazed to the conductive electrode pattern.

21. A complex semiconductor device comprising:
   an airtight package comprising:
     a bottom board member;
     ceramic lead frame components fixed on the bottom board member;
     a cap member fabricated on the lead frame components;
     ceramic terminal block components penetrating side surfaces of the ceramic lead frame components and having an outer part and an inner part, while keeping an inner space of the package hermetically sealed;
     conductive electrode patterns formed on the ceramic terminal block components and extending from an frame components to an inside of the frame components for electrically connecting outer leads with electrodes of the semiconductor devices, wherein metallized grooves are formed on some of the conductive electrode patterns on the terminal block components; and
     inward lead elements having a first end being glued in the metallized grooves of the electrode patterns within the ceramic frame components and having a free second end projecting inward in the inner space of the frame components for soldering leads of semiconductor devices; and a Peltier device fixed on the bottom board member of the package having leads, wherein the leads of the Peltier device are soldered to the free second end of the inward lead elements.

22. A complex semiconductor device comprising:

an airtight package comprising:

a bottom board member;

ceramic lead frame components fixed on the bottom board members;

a cap member fabricated on the lead frame components;

ceramic terminal block components penetrating side surfaces of the ceramic lead frame components and having an outer part and an inner part, while keeping an inner space of the package hermetically sealed;

conductive electrode patterns formed on the ceramic terminal block components and extending from an outside of the frame components to an inside of the frame components for electrically connecting outer leads with electrodes of the semiconductor devices, wherein metallized grooves are formed on some of the conductive electrode patterns on the terminal block components; and inward lead elements having a first end being glued in the metallized grooves of the electrode patterns within the ceramic frame components and having a free second end projecting inward in the inner space of the frame components for soldering leads of semiconductor devices;

a Peltier device fixed on the bottom board member of the package having leads, wherein the leads of said Peltier device are soldered to the free second end of the inward lead elements; and semiconductor devices fixed on the Peltier device to be thermally controlled having electrodes, the electrodes of the semiconductor devices except the Peltier device are connected by wires to the conductive electrode patterns on the ceramic terminal block components.

* * * * *